(12) United States Patent
Boguslavskij et al.

(10) Patent No.: US 11,193,999 B2
(45) Date of Patent: Dec. 7, 2021

(54) METHOD AND SYSTEM FOR ACTUATION OF A GRADIENT COIL

(71) Applicant: Siemens Healthcare GmbH, Erlangen (DE)

(72) Inventors: Mihail Boguslavskij, Erlangen (DE); Helmut Lenz, Oberasbach (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/923,326

(22) Filed: Jul. 8, 2020

(65) Prior Publication Data

US 2021/0011101 A1 Jan. 14, 2021

(30) Foreign Application Priority Data

Jul. 9, 2019 (DE) .......................... 102019210107.0

(51) Int. Cl.
*G01R 33/385* (2006.01)
*G01R 33/54* (2006.01)

(52) U.S. Cl.
CPC ....... *G01R 33/3852* (2013.01); *G01R 33/543* (2013.01)

(58) Field of Classification Search
USPC ........................................................ 324/309
See application file for complete search history.

(56) References Cited

U.S. PATENT DOCUMENTS

| 5,530,356 | A | * | 6/1996 | Yokoi | G01R 33/3875 |
|---|---|---|---|---|---|
| | | | | | 324/307 |
| 2011/0043206 | A1 | * | 2/2011 | Kimura | G01R 33/56341 |
| | | | | | 324/309 |
| 2013/0181713 | A1 | | 7/2013 | Eberlein et al. | |
| 2019/0137580 | A1 | * | 5/2019 | Lenz | H03F 3/217 |

FOREIGN PATENT DOCUMENTS

DE 102011079490 A1 1/2013

OTHER PUBLICATIONS

Arar S., All About Circuits: "Understanding the dynamic range specification of an ADC." Jun. 11, 2018; https://www.allaboutcircuits.com/technical-articles/understanding-the-dynamicrange-specification-of-an-ADC/ [captured May 13, 2020].
Siebert L., EETimes: "Use in-the-loop gain control to extend dynamic range." Sep. 24, 2007 https://www.eetimes.com/use-in-the-loopgain-control-to-extend-dynamic-range/# [captured May 13, 2020].
Wikipedia: "Regelkreis. Veröffentlichungsdatum" Oct. 1, 2017. https://de.wikipedia.org/w/index.php?title=Regelkreis&oldid=169583810 [captured May 13, 2020]; with English translation.
German Action dated May 13, 2020, Application No. 10 2019 210 107.0.

\* cited by examiner

*Primary Examiner* — Rodney E Fuller
(74) *Attorney, Agent, or Firm* — Schiff Hardin LLP

(57) ABSTRACT

A method for actuating a gradient coil can include the provision of a target value for a manipulated variable, the output of the manipulated variable according to the target (Continued)

value to the gradient coil, the capture of an actual value of the output manipulated variable, the scaling of the captured actual value taking into consideration a scaling characteristic depending on the target value, and the transformation of the actual value captured in a scaled manner into a digital actual value.

18 Claims, 2 Drawing Sheets

METHOD AND SYSTEM FOR ACTUATION OF A GRADIENT COIL

CROSS REFERENCE TO RELATED APPLICATIONS

This patent application claims priority to German Patent Application No. 102019210107.0, filed Jul. 9, 2019, which is incorporated herein by reference in its entirety.

BACKGROUND

Field

The disclosure relates to a method for actuating a gradient coil unit of a magnetic resonance device. The disclosure also relates to an actuation facility for a gradient coil unit of a magnetic resonance device.

Related Art

In a magnetic resonance device, the body to be examined of an examination object, particularly that of a patient, is typically exposed to a relatively strong main magnetic field of, for example, 1.5 or 3 or 7 tesla, with the aid of a main magnet. In addition, gradient pulses are played out with the aid of a gradient coil unit. Frequently occurring radio-frequency pulses, for instance excitation pulses, are then transmitted via a radio-frequency antenna unit by means of suitable antenna facilities, with the result that the nuclear spins of particular atoms resonantly excited by these radio-frequency pulses are tilted by a defined flip angle compared to the magnetic field lines of the main magnetic field. When the nuclear spins are relaxed, radio-frequency signals known as magnetic resonance signals, are emitted, and are received and then further processed using suitable radiofrequency antennas. From the raw data acquired in this way, the desired image data can finally be reconstructed.

For a particular scan, a particular magnetic resonance control sequence (MR control sequence), also known as a "pulse sequence" which consists of a sequence of radio-frequency pulses, for example excitation pulses and refocusing pulses, as well as gradient pulses to be transmitted suitably coordinated therewith on various gradient axes along different spatial directions, is therefore to be transmitted. Timed to coincide with this, readout windows are set which define the time periods in which the induced magnetic resonance signals are detected.

A gradient coil unit is preferably characterized in that a magnetic field gradient can be generated by applying an electric current according to a gradient pulse to the gradient coil unit. A gradient coil unit is typically designed to generate a magnetic field gradient with up to 100 mT/m in a defined spatial direction. Magnetic field gradients are essential for the spatial encoding of magnetic resonance signals. The gradient coil unit can also be designed to improve the homogeneity of the main magnetic field by generating a shim magnetic field. To this end it is required that a gradient coil unit can be precisely actuated with an electric current for example between 100 mA and 1200 A, i.e. in a dynamic range of up to 120 dB. The range of values of the electric current and/or an electrical voltage, with which the gradient coil unit can be actuated, is the input range of the gradient coil unit. As a result high requirements as regards accuracy, linearity, dynamic range and noise behavior are placed on the gradient coil unit, in particular on the gradient system comprising the gradient coil unit and an actuation facility.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
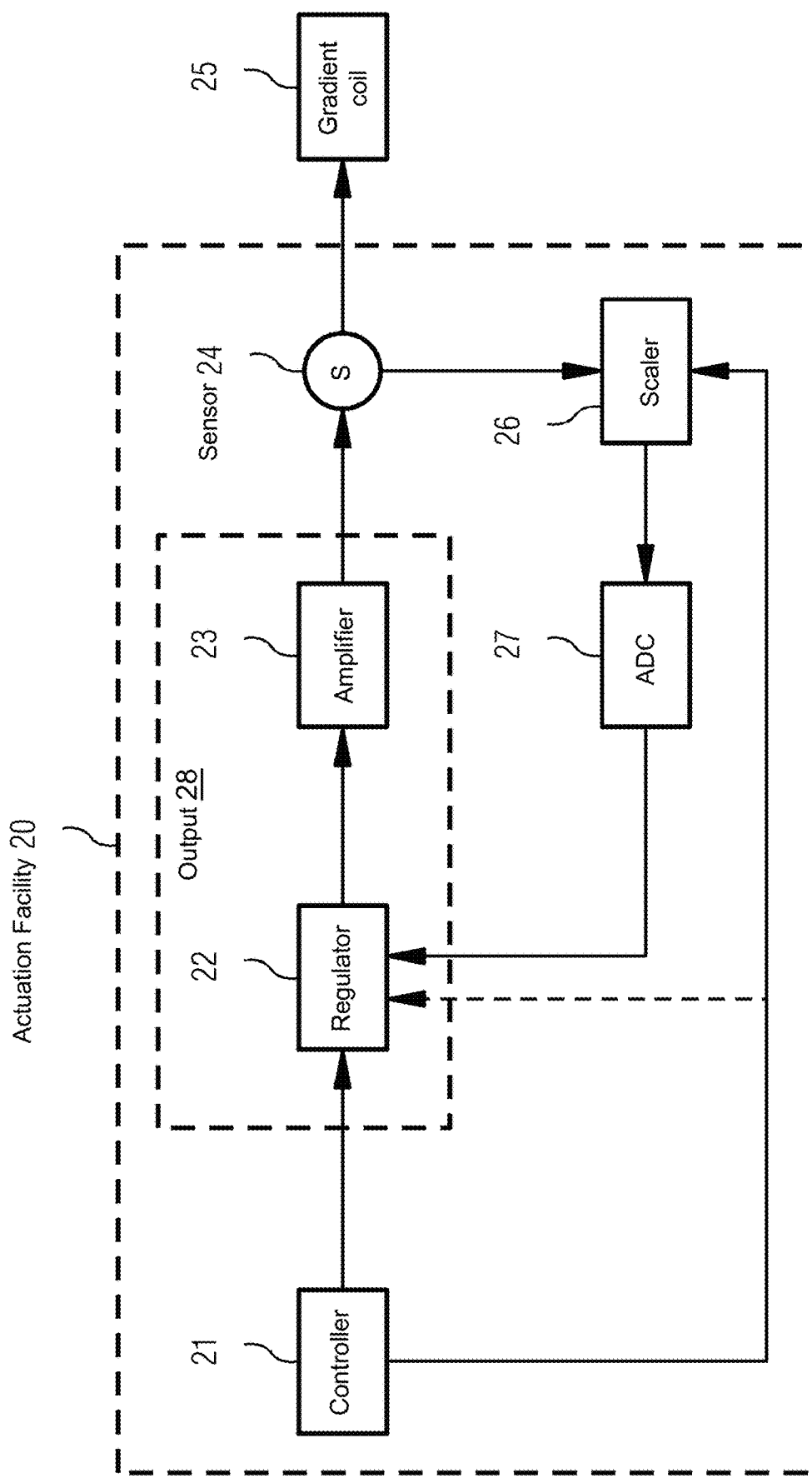
FIG. 1 illustrates a gradient system according to an exemplary embodiment.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

An object of the disclosure is to provide a method for a large dynamic range for actuating a gradient coil of a magnetic resonance device.

The method according to an exemplary embodiment of the disclosure relates to an actuation of a gradient coil according to the following method steps: provision of a target value for a manipulated variable, output of the manipulated variable according to the target value to the gradient coil, capture of an actual value of the output manipulated variable, scaling of the captured actual value taking into consideration a scaling characteristic depending on the target value, and transformation of the actual value captured in a scaled manner into a digital actual value.

In an exemplary embodiment, the gradient coil includes at least one electric conductor. The manipulated variable is typically a voltage which is applied to the electric conductor. The manipulated variable can also be an electric current which is induced in the electric conductor. The output of the manipulated variable to the gradient coil typically corresponds to the actuation of the gradient coil and/or to a generation of a gradient pulse and/or of a magnetic field gradient. The amplitude of a magnetic field gradient to be generated by the gradient coil due to an output of the manipulated variable to the gradient coil is typically proportional to the manipulated variable. The manipulated variable is typically an actually generated physical value and/or an analog value, preferably an electric conductor included in the gradient coil. The value and/or the amplitude and/or the temporal course of the manipulated variable is defined by the target value.

In a method according to an exemplary embodiment of the disclosure, the target value for the manipulated variable is made available as a digital physical value. In an exemplary embodiment, the target value is characterized in that upon actuation of the gradient coil according to this target value, a defined and/or intended magnetic field gradient is generated. The target value is typically a digital and/or theoretical value. In an exemplary embodiment, the target value is a value for an electrical voltage and/or an electric current.

In an exemplary embodiment, upon output of the manipulated variable according to the target value to the gradient coil, the target value is converted into an analog value, the manipulated variable. The aim of the conversion is typically for the actual value of the manipulated variable to correspond to the target value. The output of the manipulated variable according to the target value can initially include a conversion of the target value into an initial manipulated variable, which is typically analog, and a subsequent amplification of the initial manipulated variable into the manipulated variable. The output of the manipulated variable according to the target value can also include a generation of the manipulated variable in the electric conductor.

The actual value of the manipulated variable is the value which is actually present at a defined position in the electric conductor. The actual value can for example be different to the target value due to the design of the actuation facility and/or the gradient coil and/or the form of embodiment of the method step of the output of the manipulated variable. The actual value is typically captured at an electrical connection between the amplifier and the gradient coil by means of a sensor. The actual value is an analog value.

The captured actual value is typically converted into a digital value for further evaluation. This typically takes place using an analog-to-digital converter (ADC). The ADC typically has a defined input range within which the captured actual value must lie when it is made available so that a conversion can take place.

In an exemplary embodiment, a scaling of the captured actual value is provided before the value is made available to the ADC as an actual value captured in a scaled manner. The scaling of the captured actual value takes place taking into consideration a scaling characteristic depending on the target value. The scaling characteristic is dependent on the target value and typically includes a function comprising a translation and/or proportionality. The function typically depends on the target value. Upon scaling of the captured actual value, the actual value is modulated according to the scaling characteristic, in particular according to the function depending on the target value. The scaling typically takes place in such a way that the actual value captured in a scaled manner is included in the input range of the ADC and/or the maximum actual value captured in a scaled manner does not exceed the input range of the ADC and/or corresponds approximately to its maximum. In an optional further method step the provision of the digital actual value can take place.

It has been recognized that the value range of the target value often only includes a subrange of the input range of the gradient coil. The subrange typically includes maximum 30%, preferably maximum 20%, in particular preferably maximum 10% of the input range of the gradient coil. Singular gradient pulses can include a target value outside of the subrange.

It has also been recognized that the high dynamic range of the gradient coil is also valid for the ADC, in particular for the transformation of the actual value captured in a scaled manner into the digital actual value. It has also been recognized that the high dynamic range of the gradient coil is also valid for the sensor, in particular for the capture of the actual value of the output manipulated variable. The ADC, in particular the entry range of the ADC, is typically selected in such a way that the entry range of the ADC includes the entire value range for the target value. The greater the ratio of the entry range of the ADC to the value range for the target value and/or to the value range for the subrange, the worse is the quality of the image data. Taking the scaling characteristic into consideration depending on the target value allows a higher effective resolution of the ADC, i.e. when transforming the actual value captured in a scaled manner into a digital actual value, in particular for smaller signals.

If for example the entry range of the ADC with 18 bits lies between −1V and +1V and the captured actual value lies between −100 mV and +100 mV for the entry range of the gradient coil between −1000A and +1000A, according to a conventionally known method the captured actual value is amplified by a factor of 10 in the context of the scaling so that the actual value captured in a scaled manner fully utilizes but does not exceed the entry range of the ADC. The effective resolution for such a value range of the target value is 18 bits in this example and the scaling characteristic includes a linear dependency with a factor of 10. According to the conventional form of embodiment, this scaling characteristic is constant for all target values. When generating gradient pulses for an MR control sequence which provides for a value range for the target value between −100A and +100A, the effective resolution reduces according to the conventional method. For this MR control sequence the value range of the target value corresponds to only 10% of the entry range of the ADC, as a result of which the effective resolution for this MR control sequence reduces to approximately 15 bits. This corresponds to an increase in the quantization noise by 20 dB.

The inventive method advantageously allows an improved adaptation of the value range of the actual value captured in a scaled manner to the entry range of the ADC. The scaling therefore takes place in an adaptive manner. The inventive method prevents the increase in the quantization noise by means of a higher effective resolution of the ADC based on the scaling characteristic dependent on the target value. In this way, in particular in the case of MR control sequences which provide for a lower value range for the target value than the entry range of the gradient coil, the effective resolution of the ADC is increased which leads to a lower quantization noise and a higher quality of the image data. Alternatively, also in the case of a specified quality of the image data an ADC with lower resolution can be used, thus allowing costs to be reduced.

The method according to an exemplary embodiment provides that the target value is time-dependent and the scaling characteristic takes into consideration a value range for the target value for a defined period of time.

In an exemplary embodiment, the value range for the target value is determined by gradient pulses and/or magnetic field gradients to be output in the defined period of time, the gradient pulses and/or magnetic field gradients being generated by a corresponding manipulated variable, wherein the manipulated variable is output to the gradient coil according to the target value. The target value is therefore a variable which can be changed over time. The defined time period can for example correspond to the duration of an examination of an examination object, which is typically determined by playing out several different MR control sequences. The defined time period can for example correspond to the duration of a sequence module of an MR control sequence.

In an exemplary embodiment, a sequence module is a closed section of an MR control sequence, according to which section a defined quantity of raw data with a defined contrast and/or raw data from a particular subrange of an examination region is accommodated.

According to this embodiment, the scaling characteristic is determined for the defined period of time, where the value range of the target value within the defined period of time is known. If, for example, the value range of the target value within the defined period of time includes only 10% of the entry range of the gradient coil, on which the entry range of the ADC is configured, the scaling characteristic for this defined period of time can provide that the scaling of the captured actual value provides for a linear extension by a factor of 10. If, for example, the value range of the target value in a further period of time following on from the defined period of time includes 50% of the entry range of the gradient coil, on which the entry range of the ADC is configured, the scaling characteristic for this further period of time can provide that the scaling of the captured actual value provides for a linear extension by a factor of 2.

In particular, the value range of the target value in the defined period of time can be determined based on the time-dependent target value for the manipulated variable. Based on the minimum and maximum of the value range, the scaling characteristic can be determined individually for each period of time. This embodiment allows a particularly high effective resolution of the ADC, individually tailored to defined periods of time. A scaling characteristic which is constant for a defined period of time allows however a robust scaling within the defined period of time.

An embodiment of the method provides that the defined period of time corresponds to the timeframe of an MR control sequence to be output from the magnetic resonance device.

The value range of the target value is typically dependent on the MR control sequence to be output, in particular on the gradient pulses included in the MR control sequence. According to an exemplary embodiment, the method an MR control sequence is made available at the outset. The time-dependent target value for the manipulated variable can be determined based on the MR control sequence and/or the time-dependent target value for the manipulated variable can be extracted from the MR control sequence. In particular the value range of the target value in the defined period of time can be determined based on the time-dependent target value for the manipulated variable.

An MR control sequence is typically defined at the beginning of the examination and is not subsequently changed during the playing out of the MR control sequence. The embodiment of the method therefore uses advance information as to how the maximum and/or minimum expected current will be as a manipulated variable. This allows an analog signal preprocessing in the context of the scaling, which cannot usually be changed, to be designed adaptively, and information about a pending MR control sequence which is already available to a controller to be used.

An embodiment of the method provides that the target value and/or the value range for the target value is stipulated by gradient pulses included in an MR control sequence to be output by the magnetic resonance device. Gradient pulses are determined in particular by their amplitude and rise and fall rates, which determine the strength of the magnetic field gradient. This embodiment therefore allows a particularly precise actuation of the gradient coil.

An embodiment of the method provides that the scaling characteristic comprises a function, the function characterized in that the function of the value range is included in an entry range of the ADC. The function typically describes a mapping of the captured actual value to the actual value captured in a scaled manner. The function is preferably characterized in that the function of the value range and the entry range of the ADC differ by maximum 20%, preferably by maximum 10%, particularly preferably by maximum 5%.

In an exemplary embodiment, it is assumed that on determining the function the entire value range of the target value is scaled in the same way as the captured actual value is scaled taking into consideration the scaling characteristic in the inventive method. The use of a function allows a particularly good, preferably complete, utilization of the entry range of the ADC, as a result of which the effective resolution can be maximized.

An embodiment of the method provides that the dependency of the scaling characteristic on the target value is binary and/or incremental.

The scaling characteristic can be designed in stages, resulting in a defined scaling being provided for a subrange of the value range of the target value. According to this embodiment, target values between −100A and +100A can for example be provided with an amplification by a factor of 95 as the scaling characteristic, and target values outside of this range of −100A and +100A but within the entry range of the gradient coil can be provided with an amplification by a factor of 10 as the scaling characteristic.

A defined period of time, such as for example an MR control sequence, can be taken into consideration for the selection of the scaling characteristic, and for this defined period of time the factor of 10 or the factor of 95 can be applied to the scaling in accordance with the decision rule detailed above. This allows a particularly robust method which is easy to implement.

A method according to an exemplary embodiment includes: comparison of the digital actual value with the target value for the manipulated variable, and modification of the output of the manipulated variable according to the target value in the event of deviation of the digital actual value from the target value for the manipulated variable.

This embodiment provides for a regulation of the manipulated variable based on the digital actual value. The particularly precisely determined digital actual value according to the inventive method allows a particularly precise regulation of the manipulated variable.

An embodiment of the method provides that the scaling characteristic is taken into consideration when comparing the digital actual value with the target value.

According to this embodiment, the scaling characteristic is made available to the output, in particular to the regulator which performs the comparison between the digital actual value and the target value. As the digital actual value is typically the digital version of the actual value captured in a scaled manner and is therefore dependent on the scaling characteristic, taking the scaling characteristic into consideration when comparing the digital actual value and the target value allows a precise comparison. In this way a factor, according to which the scaling of the captured actual value took place, can in particular be taken into consideration.

An embodiment of the method provides that the provision of the target value for the manipulated variable takes place taking into consideration the scaling characteristic.

According to this embodiment, the provision of the target value for a manipulated variable includes a scaling of the target value in accordance with the scaling characteristic and the output of the scaled target value. The scaling of the target value can take place in such a way that the scaled target value utilizes the entry range of the output particularly well, in particular in an adaptive manner. The scaling of the target value preferably only differs from the scaling of the captured actual value in that the scaling of the target value takes place with regard to the entry range of the output and the scaling of the captured actual value takes place with regard to the entry range of the ADC.

The scaling of the target value in accordance with the scaling characteristic depending on the target value typically takes place with a different factor than the scaling of the captured actual value in accordance with the scaling characteristic depending on the target value.

According to this embodiment, the output can generate the manipulated variable according to the scaled target value more precisely. This embodiment likewise allows a constant ratio between the scaled target value and the digital actual value for all target values. The comparison of the digital actual value and the target value can likewise include a comparison of the digital actual value and the scaled target value. As a result the comparison can take place particularly precisely and therefore the regulation is also particularly precise.

Furthermore, the disclosure is based on an actuation facility for a gradient coil of a magnetic resonance device comprising a controller, an output, a sensor, a scaler and an ADC.

The controller is configured to provide a target value for a manipulated variable. The output preferably comprises a regulator and an amplifier. The output is configured to output the manipulated variable according to the target value to the gradient coil. The sensor is configured to capture an actual value of the output manipulated variable. The scaler is configured to scale the captured actual value taking into consideration a scaling characteristic depending on the target value. The ADC is configured to transform the actual value captured in a scaled manner into a digital actual value. Therefore the actuation facility is configured for carrying out the inventive method for an actuation of a gradient coil of a magnetic resonance device.

Furthermore the disclosure is based on a gradient system comprising the inventive actuation facility and a gradient coil. The advantages of the inventive actuation facility and the inventive gradient system essentially correspond to the advantages of the inventive method for actuating a gradient coil of a magnetic resonance device, which are explained above in detail. Features, advantages or alternative embodiments mentioned here can likewise also be transferred to the other claimed subject matters and vice versa.

FIG. 1 shows a schematic representation of a gradient system according to an exemplary embodiment. The gradient system can include a gradient coil 25 and an actuation facility 20 for the gradient coil 25. In an exemplary embodiment, the actuation facility 20 includes a controller 21, a regulator 22, an amplifier 23, a sensor 24, a scaler 26 and an analog-to-digital converter (ADC) 27. In an exemplary embodiment, the actuation facility 20 (and/or one or more components thereof) includes processor circuitry that is configured to perform one or more functions and/or operations of the actuation facility 20 (and/or one or more functions/operations of the respective component(s)).

In an exemplary embodiment, the controller 21 is configured to make available a target value for a manipulated variable for actuation of the gradient coil 25 to an output 28. In an exemplary embodiment, the controller 21 is optionally configured to take the scaling characteristic into consideration when providing the target value for the manipulated variable to the output 28 and/or to make the scaling characteristic available to the output 28. In an exemplary embodiment, the controller 21 can optionally be configured to actuate a magnetic resonance device which comprises the gradient coil 25. The actuation facility 20 and/or the controller 21 can be configured separately from the magnetic resonance device, which comprises the gradient coil 25, and/or from an MR controller included in the magnetic resonance device. The actuation facility 20 and/or the controller 21 can be integrated into the magnetic resonance device, which comprises the gradient coil 25, and/or into an MR controller. The actuation facility 20 and/or the controller 21 can be connected to the magnetic resonance device, which comprises the gradient coil 25, and/or to an MR controller. In an exemplary embodiment, the controller 21 includes processor circuitry that is configured to perform one or more functions and/or operations of the controller 21.

The output 28 comprises a regulator 22 and an amplifier 23. The output 28 is configured to output the manipulated variable according to the target value to the gradient coil 25. The regulator 22 is preferably configured to convert the target value, which is typically made available digitally, into an initial manipulated variable and/or to determine the initial manipulated variable. The initial manipulated variable is typically analog. The regulator 22 is configured to make available the initial manipulated variable of the amplifier 23. In an exemplary embodiment, the regulator 22 includes processor circuitry that is configured to perform one or more functions and/or operations of the regulator 22. The regulator 22 is typically connected to the amplifier 23 via a wired connection. The amplifier 23 is configured to amplify the initial manipulated variable, whereby the manipulated variable is generated and/or output according to the target value. The amplified initial manipulated variable preferably corresponds to the manipulated variable according to the target value. There is typically a linear relationship between the manipulated variable according to the target value and the initial manipulated variable. The linear relationship is typically defined by an amplification of the amplifier 23. The amplifier 23 is configured to generate and/or to set the manipulated variable at an electric conductor included in the gradient coil 25. The amplifier 23 is typically downstream of the regulator 22.

The regulator 22 and/or the output 28 is preferably configured to compare the digital actual value with the target value for the manipulated variable and/or in the event of deviation of the digital actual value from the target value for the manipulated variable to modify the output of the manipulated variable. The regulator 22 and/or the output 28 is optionally configured to take the scaling characteristic into consideration when comparing the digital actual value with the target value. The regulator 22 is optionally configured to carry out a scaling of the target value for the manipulated variable taking into consideration the scaling characteristic and to make the scaled target value available to the amplifier 23. In an exemplary embodiment, the regulator 22 can utilize a machine learning algorithm, such as artificial neural networks, multi-layer perceptron, regression, classifiers, reinforcement learning, or the like, to modify the output of the manipulated variable. In this example, the machine learning algorithm can be adapted based on the digital actual value feedback to the regulator 22 and/or on the scaling characteristic from the controller 21.

The sensor 24 is configured to capture an actual value of the manipulated variable generated and/or set by the amplifier 23, preferably at the electric conductor included in the gradient coil 25. The sensor 24 is configured to make available and/or to transfer the captured actual value to the scaler 26. The sensor 24 is typically arranged between the amplifier 23 and the gradient coil 25. In an exemplary embodiment, the sensor 24 is a voltage and/or current sensor. The scaler 26 is configured to scale the captured actual value by means of a scaler taking into consideration a scaling characteristic depending on the target value. The ADC 27 is configured to convert the actual value captured in a scaled manner into a digital actual value. The ADC 27 is configured to make the digital actual value available to the regulator 22. The actuation facility 20 is therefore configured to implement a method according to the disclosure.

Figure 2:
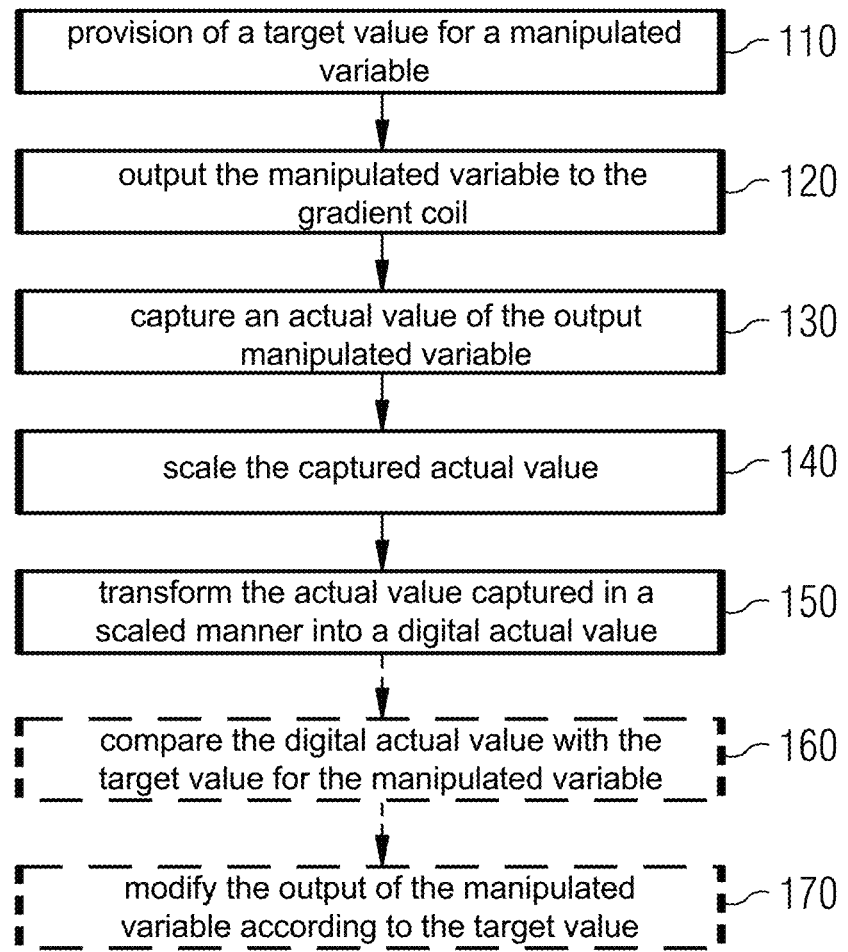
FIG. 2 is a flowchart of a method according to an exemplary embodiment.

FIG. 2 shows a flow diagram of an embodiment of a method according to the disclosure. The method begins with method step 110, the provision of a target value for a manipulated variable. Method step 110 can take place taking into consideration the scaling characteristic. Method step 120 follows, the output of the manipulated variable according to the target value to the gradient coil 25. The output of the manipulated variable typically includes determining an initial manipulated variable and amplifying the initial manipulated variable, whereby the manipulated variable is generated according to the target value. According to method step 130 the capturing of an actual value of the output manipulated variable takes place. Method step 140 comprises the scaling of the captured actual value taking into consideration a scaling characteristic depending on the target value. Method step 150 comprises the transformation of the actual value captured in a scaled manner into a digital actual value. The digital actual value is then made available.

Optionally, an embodiment of the method can comprise method step 160, a comparison of the digital actual value with the target value for the manipulated variable, and method step 170, a modification of the output of the manipulated variable according to the target value in the event of a deviation of the digital actual value from the target value for the manipulated variable.

In an exemplary embodiment, the method step 160 can take the scaling characteristic into consideration.

In an exemplary embodiment, the target value is time-dependent and the scaling characteristic takes into consideration a value range for the target value for a defined period of time.

The defined period of time can correspond to the timeframe of an MR control sequence to be output from the magnetic resonance device. The target value and/or the value range for the target value can be stipulated by gradient pulses included in an MR control sequence to be output by the magnetic resonance device. The scaling characteristic can comprise a function, the function characterized in that the function of the value range is included in an entry range of the ADC. The dependency of the scaling characteristic on the target value can be binary and/or incremental.

Although the disclosure has been illustrated and described in detail by the preferred exemplary embodiments, the disclosure is not restricted by the examples disclosed and other variations can be derived therefrom by a person skilled in the art without departing from the protective scope of the disclosure.

Any connection or coupling between functional blocks, devices, components of physical or functional units shown in the drawings and described hereinafter may be implemented by an indirect connection or coupling. A coupling between components may be established over a wired or wireless connection. Functional blocks may be implemented in hardware, software, firmware, or a combination thereof.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processor circuitry" shall be understood to be circuit(s), processor(s), logic, or a combination thereof. A circuit includes an analog circuit, a digital circuit, state machine logic, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for actuating a gradient coil, comprising:
provisioning a target value for a manipulated variable;
outputting the manipulated variable according to the target value to the gradient coil;
capturing an actual value of the output manipulated variable;
scaling the captured actual value taking into consideration a scaling characteristic depending on the target value; and
transforming the actual value captured in a scaled manner into a digital actual value.

2. The method as claimed in claim 1, wherein the target value is time-dependent and the scaling characteristic takes into consideration a value range for the target value for a defined period of time.

3. The method as claimed in claim 2, wherein the defined period of time corresponds to a timeframe of a magnetic resonance (MR) control sequence to be output from the magnetic resonance device.

4. The method as claimed in claim 2, wherein the target value and/or the value range for the target value is stipulated by gradient pulses included in a magnetic resonance (MR) control sequence to be output by a magnetic resonance device.

5. The method as claimed in claim 2, wherein the scaling characteristic comprises a function configured such that the value range is within an input range of an analog-to-digital converter (ADC) that transforms the captured actual value into the digital actual value.

6. The method as claimed in claim 1, wherein the dependency of the scaling characteristic on the target value is binary and/or incremental.

7. The method as claimed in claim 1, further comprising:
comparing the digital actual value with the target value for the manipulated variable; and
adjusting the output of the manipulated variable according to the target value based on a deviation of the digital actual value from the target value for the manipulated variable.

8. The method as claimed in claim 7, wherein the scaling characteristic is taken into consideration in the comparison of the digital actual value with the target value.

9. The method as claimed in claim 1, wherein the provision of the target value for the manipulated variable is based on the scaling characteristic.

10. The method as claimed in claim 1, further comprising adapting the outputting of the manipulated variable based on the digital actual value.

11. The method as claimed in claim 1, further comprising actuating the gradient coil based on the outputted manipulated variable.

12. The method as claimed in claim 1, wherein the outputting the manipulated variable comprises regulating the manipulated variable based on a previously captured actual value.

13. The method as claimed in claim 12, wherein the regulating the manipulated variable is further based on the scaling characteristic.

14. A computer program product having a computer program which is directly loadable into a memory of an actuation facility of a magnetic resonance (MR) system, when executed by the actuation facility, causes the acutation facility to perform the method as claimed in claim 1.

15. A non-transitory computer-readable storage medium with an executable program stored thereon, that when executed, instructs a processor to perform the method of claim 1.

16. An actuation facility for a gradient coil of a magnetic resonance (MR) device, the actuation facility comprising:
a controller configured to generate a target value for a manipulated variable;
an output configured to generate the manipulated variable according to the target value and provide the generated manipulated variable to the gradient coil;
a sensor configured to capture an actual value of the output manipulated variable;
a scaler configured to scale the captured actual value taking into consideration a scaling characteristic depending on the target value; and
analog-to-digital converter (ADC) configured to transform the actual value captured in a scaled manner into a digital actual value.

17. The actuation facility as claimed in claim 16, wherein the output comprises a regulator that is configured to adapt the manipulated variable based on the digital actual value.

18. A gradient system comprising:
the actuation facility as claimed in claim 16; and
the gradient coil.

* * * * *